United States Patent
Hsu et al.

(10) Patent No.: US 7,057,940 B2
(45) Date of Patent: Jun. 6, 2006

(54) FLASH MEMORY CELL, FLASH MEMORY CELL ARRAY AND MANUFACTURING METHOD THEREOF

(75) Inventors: Cheng-Yuan Hsu, Hsinchu (TW); Chih-Wei Hung, Hsin-chu (TW); Chi-Shan Wu, Taipei (TW); Min-San Huang, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 0 days.

(21) Appl. No.: 10/907,830

(22) Filed: Apr. 18, 2005

(65) Prior Publication Data

US 2005/0169035 A1 Aug. 4, 2005

Related U.S. Application Data

(62) Division of application No. 10/604,819, filed on Aug. 19, 2003, now Pat. No. 6,911,690.

(51) Int. Cl.
*G11C 16/04* (2006.01)
(52) U.S. Cl. .............. 365/185.29; 365/185.33
(58) Field of Classification Search ............ 365/185.29
See application file for complete search history.

(56) References Cited

U.S. PATENT DOCUMENTS

| 6,856,546 | B1 * | 2/2005 | Guterman et al. ....... 365/185.2 |
| 6,925,007 | B1 * | 8/2005 | Harari et al. .......... 365/185.15 |
| 6,934,192 | B1 * | 8/2005 | Tailliet et al. ......... 365/185.29 |

* cited by examiner

*Primary Examiner*—Thong Q. Le
(74) *Attorney, Agent, or Firm*—Jiang Chyun IP Office (57) ABSTRACT

A flash memory cell array comprises a substrate, a string of memory cell structures and source region/drain region. Each of memory cell structures includes a stack gate structure including a select gate dielectric layer, a select gate and a gate cap layer formed on the substrate; a spacer is set on the sidewall of the select gate; a control gate connected to the stack gate structure is set on the one side of the stack gate structure; a floating gate is set between the control gate and the substrate; an inter-gate dielectric layer is set between the control gate and the floating gate; and a tunneling dielectric layer is set between the floating gate and the substrate. The source region/drain region is in the substrate near outer control gate and stack gate structure of the flash memory cell array.

10 Claims, 5 Drawing Sheets

FLASH MEMORY CELL, FLASH MEMORY CELL ARRAY AND MANUFACTURING METHOD THEREOF

CROSS-REFERENCE TO RELATED APPLICATION

This application is a divisional of a prior application Ser. No. 10/604,819, filed Aug. 19, 2003, now U.S. Pat. No. 6,911,690.

BACKGROUND OF THE INVENTION

1. Field of the Invention

This invention relates generally to a semiconductor device, and more particularly to a flash memory cell array and manufacturing method thereof.

2. Background of the Related Art

Flash memory is a non-volatile solid state memory that maintains data even after all power sources have been disconnected. Flash memory has been widely used in personal computers and other electronic equipment because of its programmable features allowing writing, erasing and reading data a number of times.

A conventional flash memory cell is a transistor comprising a control gate, a doped polysilicon floating gate and an oxide layer separating these two gates from each other. A tunnel oxide layer separates the floating gate and the substrate. Because the floating gate is insulated by oxide, any negative charge on a floating gate does not leak, even if the power is off.

To write/erase the data in the cell, a bias voltage is applied to the drain in order to push electrons into the floating gate or pull electrons out of the floating gate by Fowler-Nordhem tunneling. To read the data in the cell, a working voltage is applied to the control gate to determine whether the channel is on or off. The value of the data ("0" or "1") depends on the amounts of electrons trapped in the floating gate, which affect the status of the channel.

During data erase operation, however, it is very difficult to control the amount of the electrons flowing out of the floating gate and may make the floating gate positively charged due to over-pulling the trapped electrons. This effect is so call "over-erase". If the over-erase effect is too severe, the channel will be always on, even without applying the working voltage to the control gate. It causes to mis-read the value in the cell.

To prevent the over-erase effect, some flash memory devices have used split gate design. It has an additional "select gate" on the side wall of the control gate and the floating gate and uses an oxide layer separating the select gate from the control gate, the floating gate, and the substrate. Hence, even if the over-erase effect occurred, the channel below the erase gate would still be off to avoid mis-reading the data. However, the size of the split-gate flash memory cell becomes larger than that of conventional flash memory cell because it requires a larger area for the split gate structure. This would cause the concern in high integration density issue.

One may use NAND gate array, instead of NOR gate array, for split gate flash memory in order to increase its integration density because NAND gate array allows serial connection of the memory cells. However, the write/read operations are much more complicated for NAND gate array. Furthermore, the current is smaller due to the serial connection, which seriously affects the performance of the memory cells because of a longer write/erase cycles.

SUMMARY OF THE INVENTION

An object of the invention is to provide a flash memory cell, a flash memory cell array and manufacturing method thereof to manufacture flash memory cells suitable for NAND gate array structure by using source-side injection ("SSI") to enhance the programming speed and efficiency of the cells.

It is another object of the invention to provide a flash memory cell, a flash memory cell array and manufacturing method thereof to increase the area between the control gate and the floating gate thereby increasing the gate's coupling rate to enhance the cell's performance.

The present invention provides a flash memory cell, which comprises a substrate, a stacked gate structure formed on the substrate. The stacked gate structure includes a select gate dielectric layer, a select gate, and a gate cap layer. The select gate dielectric layer is formed between the substrate and the select gate. The gate cap layer is formed on the select gate. A spacer formed is along the sidewall of the select gate, a control gate is connected to the stacked gate structure, wherein the control gate is formed on the one side of the stacked gate structure. A floating gate formed between the control gate and the substrate. The floating gate includes a recess, a inter-gate dielectric layer formed between the control gate and the floating gate. A tunneling dielectric layer is formed between the floating gate and the substrate. A drain region and a source region are formed in the substrate, wherein the drain region and the source region are formed on the one side and the other side of the control gate and the stacked gate structure respectively.

In the present invention, the floating gate includes a recess. This increases the contact surface area between the control gate and the floating gate to raise the gate coupling rate of flash memory cells and to reduce the working voltage, thereby enhancing flash memory cells' operation speed and efficiency.

The present invention also provide a flash memory cell army, which comprises a substrate, a plurality of flash memory cell structures on the substrate, and a drain region and a source region are formed in the substrate, wherein the drain region and the source region are formed on the one side mid the other side of the control gates and the stacked gate structures respectively. Each of the flash memory cell structures includes a stacked gate structure formed on the substrate. The stacked gate structure includes a select gate dielectric layer, a select gate and a gate cap layer wherein the select gate dielectric layer is formed between the substrate and the select gate and the gate cap layer is formed on the select gate. A spacer is formed along the sidewall of the select gate. A control gate is connected to the stacked gate structure. The control gate is formed on one side of the stacked gate structure. A floating gate is formed between the control gate and the substrate and includes a recess, Art inter-gate dielectric layer is formed between the control gate and the floating gate, wherein the control gate, the inter-gate dielectric layer, and the floating gate, constitutes a stack structure. A tunneling dielectric layer is formed between the floating gate and the substrate. The stacked gate structure of the plurality or flash memory cell structures are positioned juxtaposing alternatively with the stack structure.

Because there is no gap between each flash memory cell structure, and therefore a highly integrated flash memory cell array can be realized. Furthermore, the floating gate includes a recess. This increases the contact surface area between the control gate and the floating gate to raise the gate coupling rate of flash memory cells and to reduce the working voltage, thereby enhancing flash memory cells' operation speed and efficiency.

This present invention also provides a method for fabricating a flash memory cell array. A substrate having a device insulating structure is provided. A plurality of stacked gate structures are formed on the substrate. The stacks gate structure includes a select gate dielectric layer, a select gate, and a cap layer, the select gate dielectric layer formed between the substrate and the select gate, the cap layer formed on the select gate. A tunnel dielectric layer is formed on the substrate. A spacer is formed along the sidewall of the select gate. A floating gate is formed between each of the stacked gate structures, wherein the floating gate includes a recess, and an top surface of the floating gate connected to the stacked gate structure is between a top surface of the cap layer and a top surface of the select gate. Next an inter-gate dielectric layer is formed on the floating gate. Next, a control gate is formed to fill the gap between each of the stacked gate structures. Then the plurality of stacked gate structures are removed to isolate a predetermined area of the flash memory cell array. Next, a drain region and a source region are formed in the substrate, wherein the drain region and the source region are positioned on the one side and the other side of the control gates and the stacked gate structures respectively.

In this present invention, the steps of forming the floating gate include forming a first conducting layer on the substrate; forming a material layer on the first conducting layer, wherein the material layerfills the gap between each of the stacked gate structures; removing a portion of the material layer until the top surface of the material layer is between the top surface of said cap layer and the top surface of the select gate; removing a portion of the first conducting Layer by using the material layer as a mask; removing the material layer; mid removing the portion of the first conducting layer on the device insulating structure to form the floating gate.

In this present invention, the step of forming the control gate step includes forming a second conducting layer on the substrate; and removing a portion of the second conducting layer, until the top surface of the cap layer is exposed, to form the control gate.

In the present invention, the floating gate includes a recess. This increases the area between the control gate and the floating gate to raise the gate coupling rate of flash memory cells and to reduce the working voltage, thereby enhancing flash memory cells' operation speed and efficiency.

Moreover, this present invention fills the gap between the stacked gate structures with a conducting layer to form the control gate. Hence the process of the present invention is more simplified compared to the conventional process because no photolithography process is involved.

Furthermore, the present invention uses the hot carrier effect to program each flash memory cell as a unit, and uses Fowler-Nordhem tunneling to erase the entire flash memory cell array. Hence, the higher efficiency for electron injection can reduce the current required for operating the flash memory cell and increase the operation speed. Furthermore, it also reduces the energy consumption of the entire array.

The present invention also provides a method for fabricating a flash memory cell array. A substrate having a device insulating structure is provided. Next, a plurality of stacked gate structures are formed on the substrate, wherein the stacked gate structure including a select gate dielectric layer, a select gate, and a cap layer, the select gate dielectric layer formed between the substrate and the select gate, and wherein the cap layer is formed on the select gate. Next, a tunnel dielectric layer is formed on the substrate. Next, a spacer is fanned along the sidewall of the select gate. Next, a floating gate is formed between the stacked gate structures. An inter-gate dielectric layer is formed on the floating gate. A control gate is formed to fill at least one gap between the stacked gate structures. A portion of the stacked gate structures excluding a predetermined area of the flash memory cell array are removed. A drain region and a source region are formed in the substrate, wherein the drain region and the source region are formed on the one side and the other sick of the control gates and the stacked gate structures respectively.

In this present invention, the step of forming the floating gate further comprises forming a first conducting layer on the substrate; removing a portion of the first conducting layer until the top surface of the first conducting layer is between the top surface of the cap layer and the top surface of the select gate; and removing the portion of the first conducting layer on the device insulating structure to form the floating gate.

In this present invention, the step of forming the control gate further comprises forming a second conducting layer on the substrate; and removing a portion of the second conducting layer, until the top surface of the cap layer is exposed, to form the control gate.

Moreover, this present invention fills the gap between the stacked gate structures with a conducting layer to form the control gate. Hence the process of the present invention is substantially simplified compared to the conventional process because no photolithography is involved.

The above is a brief description of some deficiencies in the prior art and advantages of the present invention. Other features, advantages and embodiments of the invention will be apparent to those skilled in the art from the following description, accompanying drawings and appended claims.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 1A:
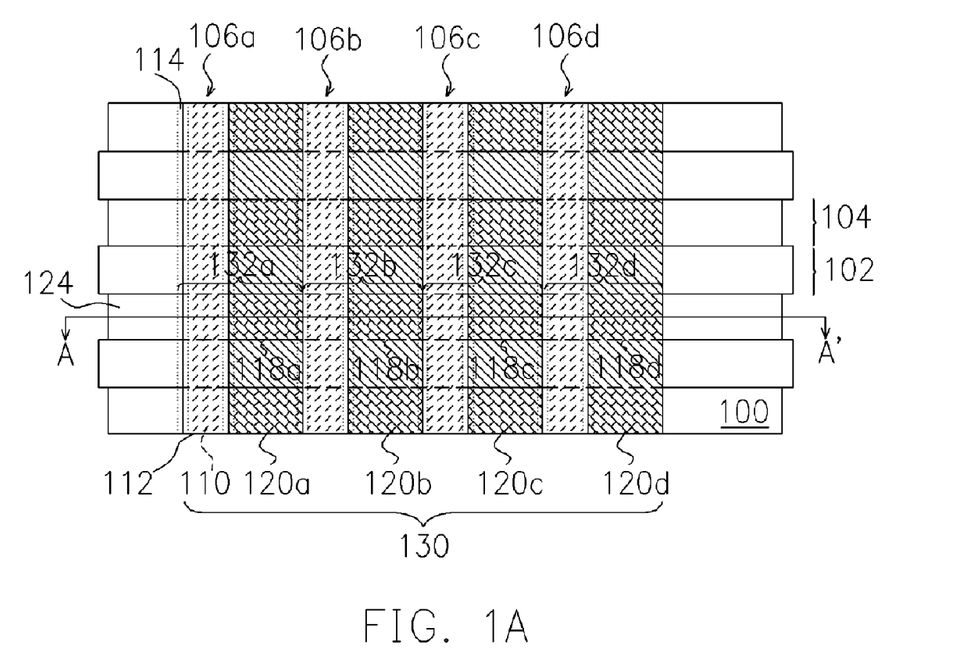
FIG. 1A is a top view of a NAND type flash memory cell array of the present invention.
Figure 1B:
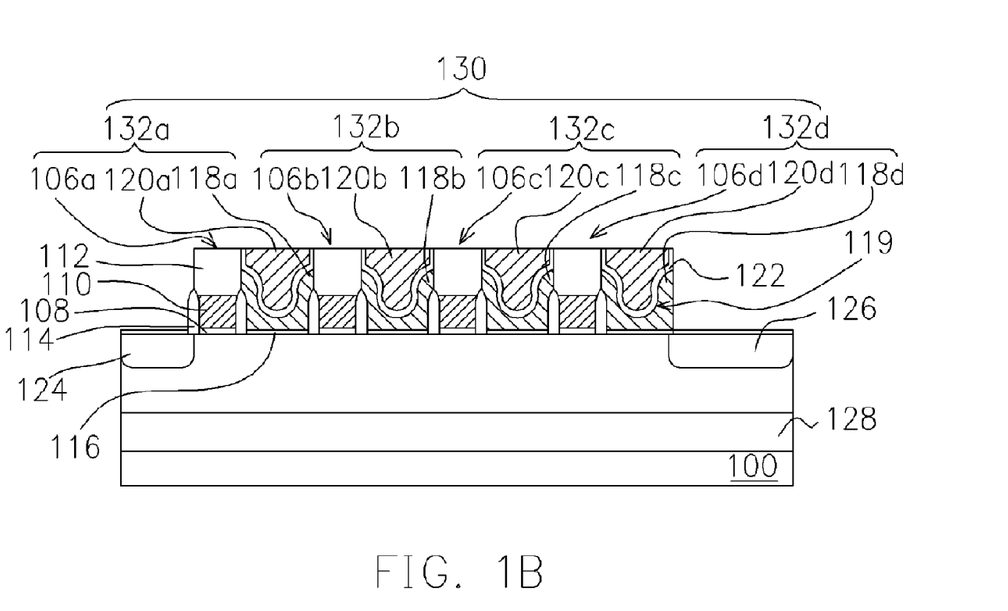
FIG. 1B is a cross section of a NAND type flash memory cell array taken along the line A–A' of FIG. 1A.

FIG. 1A shows a top view of a NAND type flash memory cell array of the present invention. FIG. 1B show the cross section (along A–A' of FIG. 1A) of a NAND type flash memory cell array of the present invention.

Referring to FIGS. 1A and 1B, the flash memory cell structure of the present invention comprise a substrate 100; a device insulating structure 102, an active region 104; a plurality of stacked gate structures 106a–106d, wherein each of the stacked gate structure includes a select gate dielectric layer 108, a select gate 110 and a gate cap layer 112); a spacer 114, a tunneling dielectric layer 116, a plurality of floating gates 118a–118d, a plurality of control gates 120a–120d, a plurality of inter-gate dielectric layers 122, a drain region 124, and a source region 126.

In a preferred embodiment of the present invention, substrate 100 is a P-type substrate, and there is a deep N well 128 in substrate 100. Device insulating structure 102 is set in substrate 100 to define the active region 104.

A plurality of stacked gate structures 106a–106d is set on the substrate 100 and perpendicular to the active region 104. In a preferred embodiment of the present invention, the thickness of stacked gate structures 106a–106d is about 2000–3500 ANG. The material of the select gate dielectric layer 108 is comprised of, for example, silicon dioxide with a thickness of about 160–170 ANG. The material of the select gate 110 comprises, for example, doped polysilicon with a thickness of about 600–1000 ANG. The material of the gate cap layer 112 comprises, for example, silicon dioxide with a thickness of about 1000–1500 ANG. The spacer 114 is set along the sidewall of the select gate 110. In a preferred embodiment of the present invention, the material of spacer 114 comprises, for example, silicon dioxide.

A plurality of control gates 120a–120d are set on the substrate 100 and on the one side cite stacked gate structures 106a–106d respectively, and are orthogonal to the active region 104. Control gates 120a–120d are connected to stacked gate structures 106a–106d respectively, i.e., the stacked gate structures juxtapose alternatively with control gates. In a preferred embodiment of the present invention, the material of the control gates 120a–120d comprises, for example, doped polysilicon.

The floating gates 118a–118d are respectively set above the substrate 100 where the control gates 120a about 120d cross the active region 104. Namely, floating gates 118a–118d are set between the control gates 120a–120d and the active region 104 of the substrate 100. For example, each of the floating gates 118a–118d has a recess opening 119, and the upper surfaces of the floating gates 118a about 118d at the the stacked gate structures 106a–106d side could be formed between the upper surface of the select gate 110 and the upper surface of the cap layer 112, for example.

The tunneling dielectric layer 116 is set between the floating gates 118a–118d and the substrate 100. The inter-gate dielectric layer 122 is set between the control gates 120a–120d and the floating gates 118a–118d. In a preferred embodiment of the present invention, the material of the tunneling dielectric layer 116 comprises, for example, silicon dioxide with a thickness of about 60–90 Å. The material of the inter-gate dielectric layer 122 comprises, for example, silicon, dioxide/silicon nitrite/silicon dioxide with a thickness of about 70/70/60 Å. The material of the inter-gate dielectric layer 122 comprises, for example, silicon dioxide/ silicon nitrite.

In the active region 104, the flash memory cell array 130 comprises a plurality of stacked gate structures 106a–106d, a spacer 114, a tunnel dielectric layer 116, a plurality of floating gate 118a–118d, a plurality of control gates 102a120d, and an inter-gate dielectric layer 122. A drain region 124 in substrate 100 is set on the one side of the stacked gate structure 106a of the flash memory cell array 130. A source region 126 in substrate 100 is set on the one side of the control gate 120d of the flash memory cell array 130. That is, the flash memory cell array 130 comprises a plurality of stacked gate structures including a plurality control gates 102a–120d and a plurality of floating gates 118a–118d, and a plurality of stacked gate structures 106a106d, wherein each of stacked gate structures 106a–106d and each of the stack structures juxtapose alternatively. The drain region 124 and the source region 126 are set on each side of the flash memory cell array 130.

In the flash memory cell array 130, the stacked structures (which include control gate 120a–120d and floating gates 118a–118d) and stacked gate structures 106a–106d in the active region 104 constitute the flash memory cell structures 132a–132d respectively. Because there is no gap between the flash memory cell structures 132a–132d, this design allows further increase in the integration density of the flash memory cell array 130.

Furthermore, in a preferred embodiment of the present invention, each of floating gates 118a–118d includes a recess 119. This recess 119 increases the contact surface area between floating gates 118a–118d and control gates 120a–120d, which raises the gate coupling rate of flash memory cells and reduce the working voltage, thereby enhancing flash memory cells' operation speed and efficiency.

The above embodiments illustrate four flash memory cell structures as an example to describe the merits of the invention. One skilled in the art may apply any number of flash memory cell structures as needed.

Figure 1C:
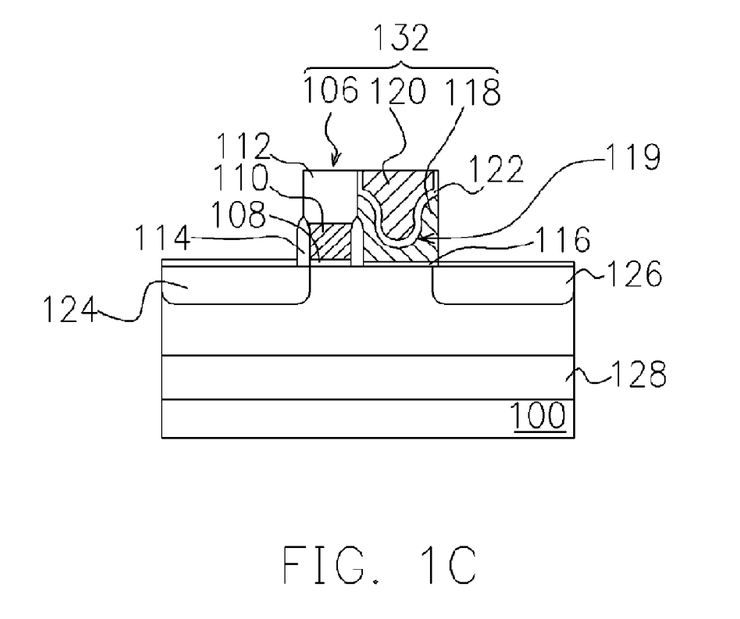
FIG. 1C is a cross section of a flash memory cell structure of the present invention.

FIG. 1C shows the cross section of a single flash memory cell structure of the present invention. This single flash memory cell structure 132 includes a stacked gate structures 106, a spacer 114, a tunneling dielectric layer 116, a floating gates 118, a control gate 120, an inter-gate dielectric layer 122, a drain region 124 set on the one side of stacked gate structures 106, and a source region 126 set on the one side of control gate 120. In a preferred embodiment of the present invention, floating gate 118 includes a recess 119. This recess 119 increases the contact surface area between floating gate 118 and control gate 120, which raises the gate coupling rate of flash memory cells and reduce the working voltage, thereby enhancing flash memory cell structure's operation speed and efficiency.

The following description will illustrate the method of fabricating a flash memory cell array.

Figure 2A:
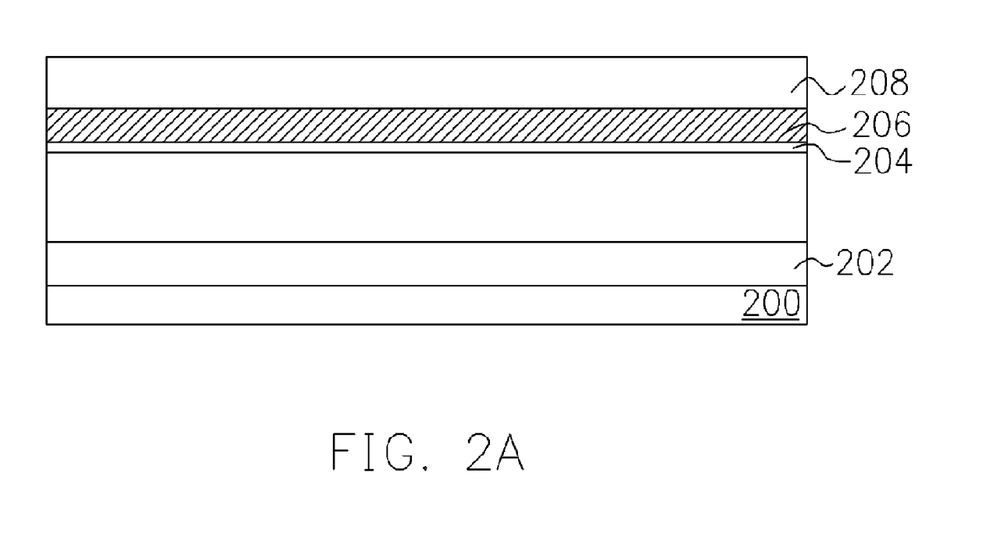
FIGS. 2A–2F show a progressive process flowchart of a NAND type flash memory cell array according to a preferred embodiment of the present invention.

Referring to FIG. 2A, A substrate 200 is provided. The substrate 200 is, for example, a P-type substrate. A device insulating structure (not shown in the figures) and a deep N well 202 are formed in substrate 200. Then a dielectric layer 204, a conducting layer 206 and a cap layer 208 are formed in substrate 200 in sequence. Preferably, the material of the dielectric layer 204 comprises, for example, silicon dioxide. For example, the dielectric layer 204 may be formed by thermal oxidation. Preferably, the material of the conducting layer 206 comprises doped polysilicon and can be formed by depositing a layer of undoped polysilicon by using a chemical vapor deposition (CVD) process and followed by an ion implantation. The material of the cap layer 208 is comprised of, for example, a silicon dioxide and can be formed by using a chemical vapor deposition (CVD) process using tetra ethyl ortho silicate (TEOS) and ozone.

Figure 2B:
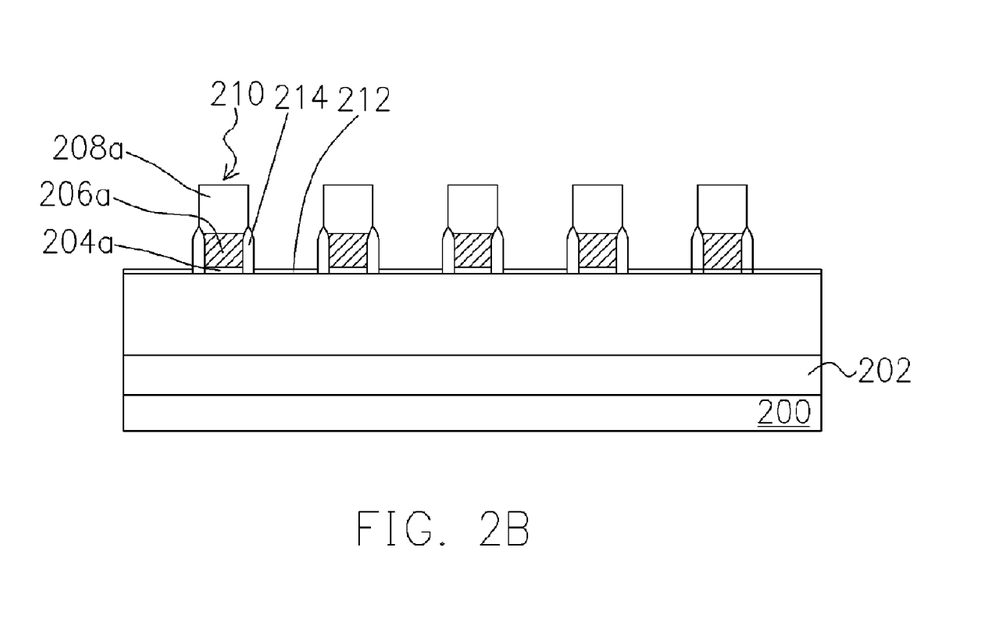

Referring to FIG. 2B, the cap layer 208, the conducting layer 206, and the dielectric layer 204 are patterned to form a gate cap layer 208a, a gate conducting layer 206a, and a gate dielectric layer 204a, constituting the stacked gate structure 210. The gate conducting layer 206a and the gate dielectric layer 204a serve as the select layer and the select gate dielectric layer of the flash memory cell respectively.

A tunneling dielectric layer 212 is formed on the substrate 200. Next, a spacer 214 is formed on the sidewall of the gate conducting layer 206a. Preferably, the tunneling dielectric layer 212 and the spacer 214 are formed by performing thermal oxidation.

Figure 2C:
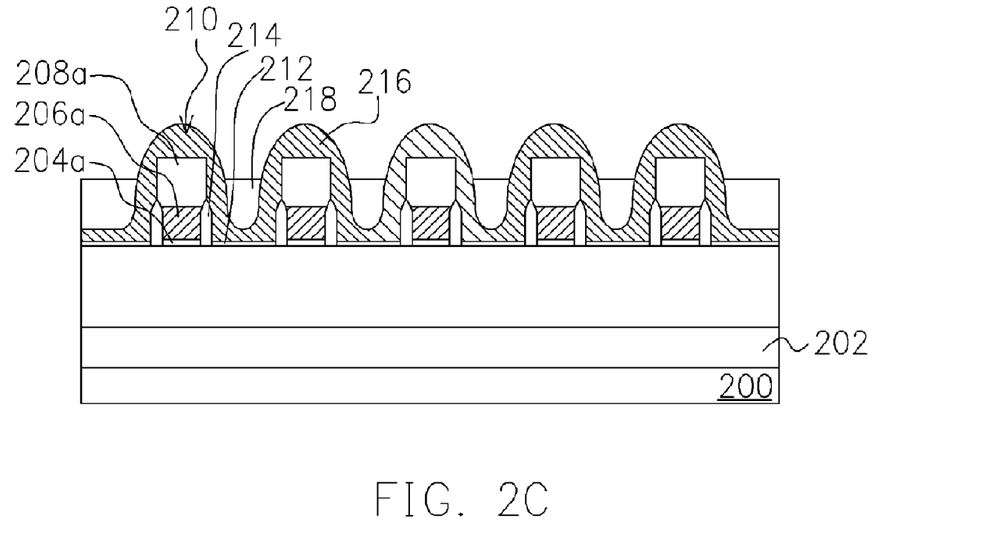

Referring to FIG. 2C, another conducting layer 216 is formed on the substrate 200 such that the conducting layer 216 does not completely fill or partially fill the gap between the stacked gate structures 210. Preferably, the material of conducting layer 216 comprises doped polysilicon and can be formed by depositing an undoped polysilicon layer using a chemical vapor deposition process and then performing an ion implantation.

A material layer 218 is formed over the conducting layer 216 to completely fill the gap between the stacked gate structure 210, such that a top surface of the material layer 218 is laterally positioned between a top portion of the gate cap layer 208a and a top portion of the gate conducting layer 206a. Preferably, the material of the material layer 218 is comprised of a photoresist layer or an anti-reflecting coating layer and can be formed by performing a spin-coating process and then etching back.

Figure 2D:
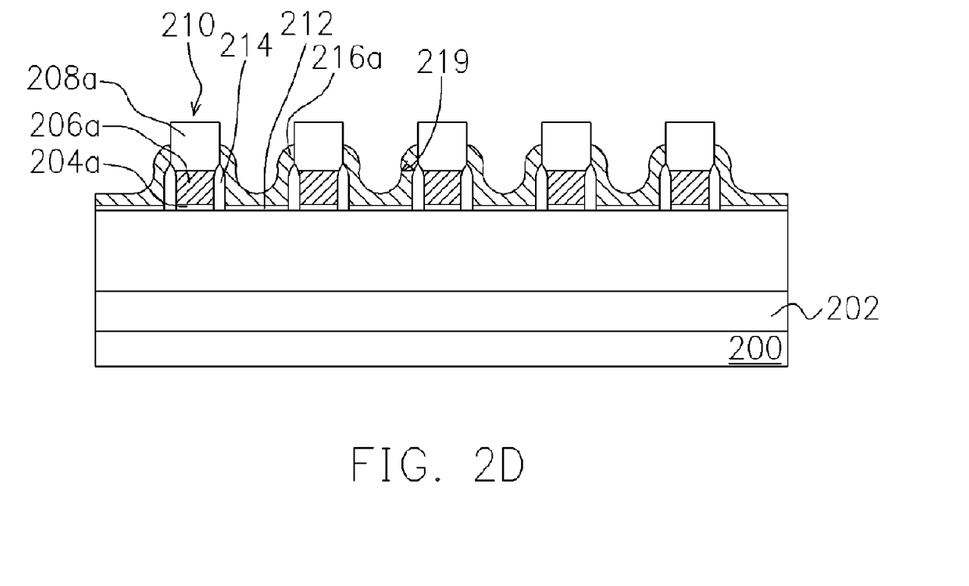

Referring to FIG. 2D, a portion of the conducting layer 216 is removed by using the material layer 218 as a mask, so that a top surface of the remaining conducting layer 216 is laterally positioned between a top portion of the gate conducting layer 206a and a top portion of the gate cap layer 208a. After removing the material layer 218, a photolithography etching process is performed to remove a portion of conducting layer 216 positioned above the device insulating structure, in order to form a patterned conducting layer 216a between the stacked gate structures 210. The patterned conducting layer 216a forms the floating gate of the flash memory cell. The patterned conducting layer 216a includes a recess 219 so as to increase the contact surface area between itself and the control gate that is subsequently formed. Alternatively, the patterned conducting layer 216a can be formed by performing an etching back to remove a portion of conducting layer 216 so that a top surface of the conducting layer 216 is laterally positioned between a top surface of the gate conducting layer 206a and a top surface of the gate cap layer 208a. A portion of the conducting layer 216 positioned above the device insulating structure is removed to form the patterned conducting layer 216a.

Figure 2E:
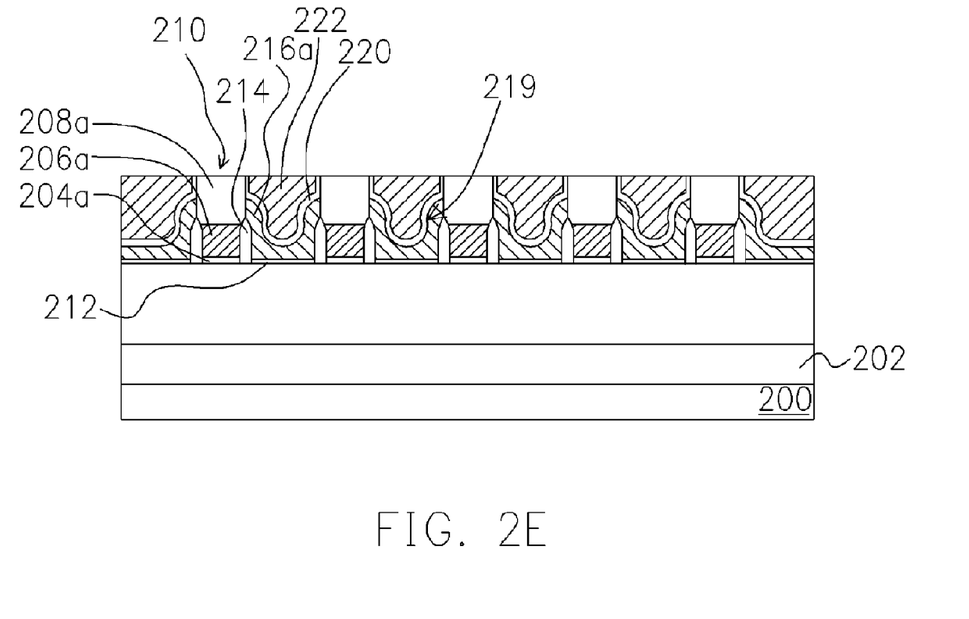

Referring to FIG. 2E, an inter-gate dielectric layer 220 is formed over the patterned conducting layer 216a. Preferably, the material of the inter-gate dielectric layer 220 comprises silicon dioxide/silicon nitride/silicon dioxide, and can be formed by performing a thermal oxidation to form a silicon dioxide layer and then performing a CVD to form a silicon nitride layer and a silicon dioxide layer. Then another conducting layer 222 is formed over the substrate 200 to completely fill the gap between the stacked gate structures 210. Preferably, the conducting layer 222 is formed by forming a conducting material layer over substrate 200 and then removing a portion of conducting material layer until a top surface of the gate cap layer 208a is exposed. The material of the conducting layer 222 comprises doped polysilicon and can be forming by forming an undoped polysilicon layer using a chemical vapor deposition and then performing an ion implantation.

Figure 2F:
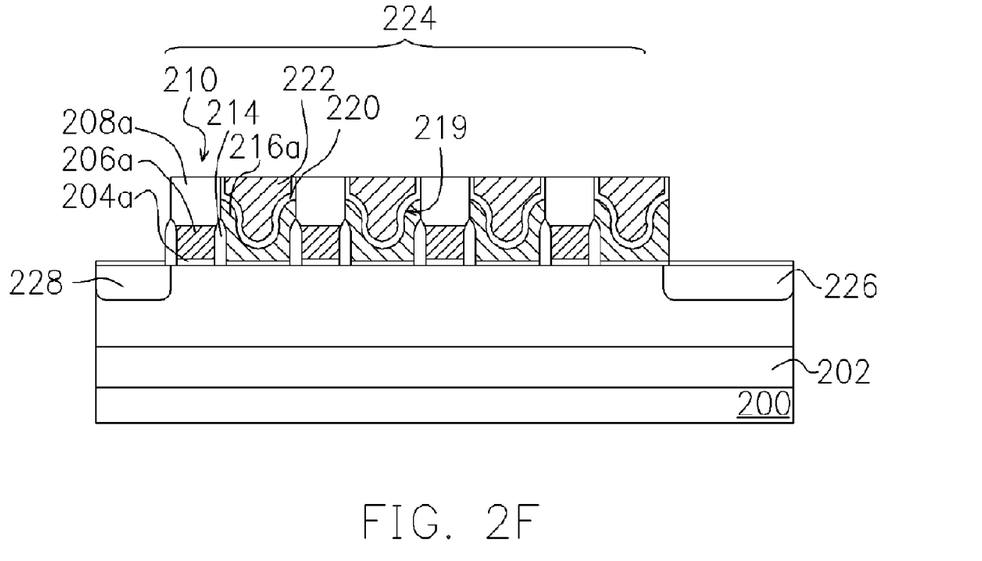

Referring to FIG. 2F, a patterned photoresist layer (not shown) is formed over the substrate 200 to cover a predetermined area for forming the flash memory cell array 224.

Then the exposed stacked gate structures or conducting layers are removed by using the patterned photoresist layer as a mask. Then the source region 226 and the drain region 228 are Conned in the substrate 200 located at two sides of the flash memory cell array 224 by ion implantation. The drain region 226 is positioned on one side of the flash memory cell array 224 with the conducting layer 222 (control gate). The source region 228 is positioned on the other side of the flash memory cell array 224 with the stacked gate structure 210 (select gate). The rest of the fabrication process of the flush memory cell array 224 is well known to those skilled in the art and therefore will not be described hereinafter.

In a preferred embodiment of the present invention, the floating gate (patterned conducting layer 216a) includes a recess. This recess increases the contact surface area between the floating gate (patterned conducting layer 216a) and the control gate (conducting layer 222), which raises the gate coupling rate of flash memory cells and reduce the working voltage, thereby enhancing flash memory cell structure's operation speed and efficiency.

Moreover, the gap between the stacked gate structures 210 is filled with a conducting layer to form the control gate (conducting layer 222). Hence the fabrication process of the present invention is more simplified compared to the conventional process because no photolithography process is required.

The above embodiments of the present invention illustrate the method of fabricating four flash memory cell structures as an example however the present invention is not restricted to fabrication of four memory cell structures, any number of flash memory cell structures may be fabricated as required using the fabrication process of the present invention.

Figure 3:
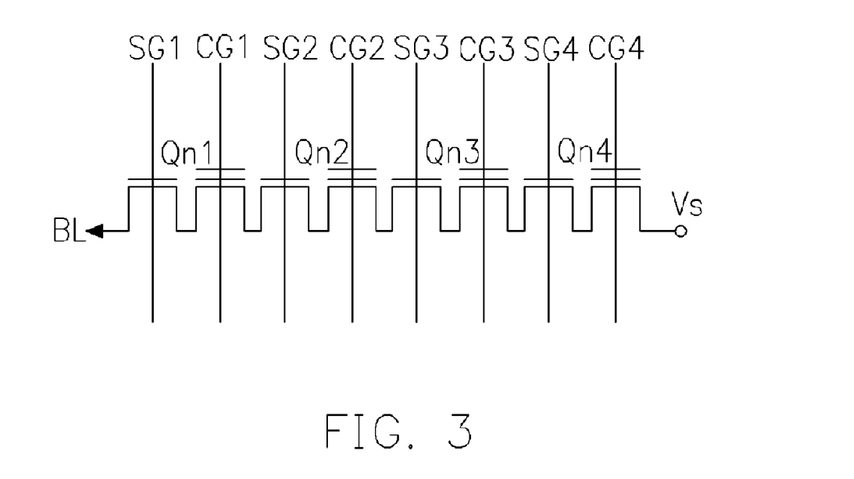
FIG. 3 shows a circuit layout of a NAND type flash memory cell array of the present invention.

FIG. 3 shows a simplified circuit of a NAND type flash memory cell array of the present invention. In FIG. 3, an embodiment of a four flash memory cell array is used to demonstrate its operation.

Referring to FIG. 3, this flash memory cell array includes four flash memory cells Qn1–Qn4 serial connected, select gate lines SG1–SG4 connected to the select gates of Qn1–Qn4 respectively, and control gate line CG1–CG4 connected to the control gates of Qn1–Qn4 respectively.

Before programming the array, a 4.5V, a 7V, a 11V, and a 0V are applied to the source region, SG1–SG4, CG1–CG4, and the drain region respectively, to turn on the channels of Qn1–Qn4. During programming the array, using Qn2 as an example, a 4.5V, a 1.5V, a 7V, a 9V, a 11V, and a 0V are applied to the source region, the selected select gate line SG2, the non-selected select gate lines (SG1, SG3, and SG4), the selected control gate line CG2, the non-selected control gate lines (CG1, CG3, and CG4), and the substrate respectively, to cause source-side injection in order to inject electrons into the selected flash memory cell Qn2 and program it.

During reading the data from the array, a 0V, a 4.5V, a 1.5V, and a 1.5V are applied to the source region, SG1–SG4, CG1–CG4, and the drain region (the bit line) respectively. The value of the cell ("0" of "1") depends on whether the floating gate is negatively charged or positively charged. If the floating gate is negatively charged, the flash memory cell's channel is off and the current is small. On the other hand, if the floating gate is positively charged, the flash memory cell's channel is on and the current can pass through the channel.

During erasing the data in the array, a 0V is applied to source region, SG1–SG4, and CG1–CG4 and a 11V is applied to the substrate, thereby causing Fowler-Nordhem tunneling to push electrons from the floating gates into the substrate to erase the flash memory cell array.

The present invention uses the hot carrier effect to program each flash memory cell as a unit, and uses Fowler-Nordhem tunneling to erase the entire flash memory cell array. Hence, the higher efficiency for electron injection can reduce the current required for operating the flash memory cell and increase the operation speed. Furthermore, it also reduces the energy consumption of the entire array.

The above description provides a full and complete description of the preferred embodiments of the present invention. Various modifications, alternate construction, and equivalent may be made by those skilled in the art without changing the scope or spirit of the invention. Accordingly, the above description and illustrations should not be construed as limiting the scope of the invention which is defined by the following claims.

What is claimed is:

1. A method of operating a flash memory cell array, said flash memory cell array comprising a serial connection of a plurality of flash memory cells, a drain region and a source region in a substrate and positioned on the one side and the other side out of said control gates and said stacked gate structures respectively, each of said flash memory cell including a stacked gate structure having a select gate, a control gate positioned and connected on the one side of said stacked gate structure, a floating gate positioned between said control gate and said substrate, wherein said stacked gate structure of said plurality of flash memory cell structures juxtaposing alternatively with a stack structure having said control gate and said floating gate, said method comprising: before programming said flash memory cell array, applying a first voltage, a second voltage, and a third voltage to said source region, said select gates, and said control gates respectively and applying substantially 0 voltage to said drain region and said substrate, in order to turn on the channels of said flash memory cells; during programming said flash memory cell array, applying said first voltage, a fourth voltage, said second voltage, a fifth voltage, said third voltage, and substantially 0 voltage to said source region, said select gates of selected said flash memory cells, said select gates of non-selected said flash memory cells, said control gates of said selected flash memory cells, said control gates of said non-selected flash memory cells, and said substrate respectively, to cause source-side injection in order to inject electrons into said selected flash memory cells to program said selected flash memory cells; during reading said flash memory cell array, applying substantially 0 voltage, a sixth voltage, a seventh voltage, and a eight voltage to said source region, said select gates, said control gates, said drain region respectively; and during erasing said flash memory cell array, applying substantially 0 voltage to said source region and said select gates arid said control gates, and applying a ninth voltage to said substrate, to cause Fowler-Nordhem tunneling in order to push electrons from said floating gates into said substrate to erase said flash memory cell array.

2. The method of operating a flash memory cell array of claim 1, wherein said first voltage is substantially equal to 4.5 V.

3. The method of operating a flash memory cell array of claim 1, wherein said second voltage is substantially equal to 7 V.

4. The method of operating a flash memory cell array of claim 1, wherein said third voltage is substantially equal to 11 V.

5. The method of operating a flash memory cell array of claim 1, wherein said fourth voltage is substantially equal to 1.5 V.

6. The method of operating a flash memory cell array of claim 1, wherein said fifth voltage is substantially equal to 9 V.

7. The method of operating a flash memory cell array of claim 1, wherein said sixth voltage is substantially equal to 4.5 V.

8. The method of operating a flash memory cell array of claim 1, wherein said seventh voltage is substantially equal to 1.5 V.

9. The method of operating a flash memory cell array of claim 1, wherein said eighth voltage is substantially equal to 1.5 V.

10. The method of operating a flash memory cell array of claim 1, wherein said ninth voltage is substantially equal to 11 V.

* * * * *